United States Patent [19]
Yagihashi

[11] Patent Number: 5,393,929
[45] Date of Patent: Feb. 28, 1995

[54] ELECTRICAL INSULATION AND ARTICLES THEREOF

[75] Inventor: Hideo Yagihashi, Saitama, Japan

[73] Assignee: Junkosha Co. Ltd., Tokyo, Japan

[21] Appl. No.: 156,599

[22] Filed: Nov. 23, 1993

[51] Int. Cl.⁶ .................. H01B 7/02; H01B 11/18; B32B 27/32

[52] U.S. Cl. ................. 174/36; 174/102 R; 174/110 FC; 174/120 R; 428/319.7; 428/422

[58] Field of Search ......... 174/102 R, 120 R, 120 SR, 174/110 FC, 36; 428/319.7, 422

[56] References Cited

U.S. PATENT DOCUMENTS

| | | | |
|---|---|---|---|
| 4,380,523 | 4/1983 | Lind et al. | 264/257 |
| 4,408,089 | 10/1983 | Nixon | 174/34 |
| 4,515,993 | 5/1985 | MacKenzie | 174/102 R |
| 4,521,485 | 6/1985 | Tondre et al. | 174/110 FC |
| 4,678,709 | 7/1987 | Tondre et al. | |
| 4,985,296 | 1/1991 | Mortimer, Jr. | 428/220 |
| 5,064,593 | 11/1991 | Tamaru et al. | 264/113 |
| 5,245,134 | 9/1993 | Vana, Jr. et al. | 174/117 F |

FOREIGN PATENT DOCUMENTS

| | | |
|---|---|---|
| 0367629 | 5/1990 | European Pat. Off. |
| 3632883 | 3/1988 | Germany |

*Primary Examiner*—Morris H. Nimmo
*Attorney, Agent, or Firm*—Gary A. Samuels

[57] ABSTRACT

A light-weight, but strong and cut-through resistant electrical insulation tape, which is a laminate of porous polytetrafluoroethylene and polyetheretherketone. Also described are insulated wires and coaxial cables using the electrical insulation tape.

10 Claims, 3 Drawing Sheets

ELECTRICAL INSULATION AND ARTICLES THEREOF

FIELD OF THE INVENTION

This invention relates to a laminated tape for use as electrical insulation, and to its use in insulated wire and cable articles.

BACKGROUND OF THE INVENTION

As electrical insulation, especially for aircraft frame wire insulation, materials such as polytetrafluoroethylene (hereinafter "PTFE"), copolymer of ethylene and tetrafluoroethylene (hereinafter "ETFE"), crosslinked-ETFE, polyimide, polyester, etc. have often been used through extrusion or tape-wrap processes. Moreover, glass cloth impregnated with PTFE or continuously porous PTFE sheet impregnated in the surface portion with meltable resins have been used as substrates for printed circuit boards for high frequency applications.

However, the materials mentioned above do not have the performance characteristics required for electrical air-frame wire insulation such as light weight, high mechanical strength, cut-through resistance, heat resistance, and chemical resistance altogether at one time. That is, PTFE is not mechanically strong; ETFE and crosslinked ETFE have high specific gravity; polyimide is stiff and undergoes hydrolysis; and polyester is not highly heat resistant. Moreover, these materials, except for PTFE, have a dielectric constant exceeding 2.1. Thus, none are ideally suited for the dielectric insulation material of coaxial cables for high speed signal transmission.

Continuously porous PTFE, such as expanded PTFE, excels in that it has a dielectric constant far less than 2.1, and low density, however, it is not as mechanically strong as desired for air-frame electrical wiring. Thus it does not meet all the requirements together.

PTFE-impregnated glass cloth has an increased dielectric constant, so that its use as a substrate material is limited in terms of electrical frequency. Continuously porous PTFE substrate material impregnated in the surface region with meltable polymer resins has a porous intermediate region or area where the resin is not present so the dielectric constant remains low, thus it can be used as a high frequency substrate material or electrical insulation for high speed signal transmission wiring. However, due to the porous region, this material can easily be deformed by mechanical stress, causing the electrical properties to change. Thus, printed circuit boards or insulated wiring using this material need to be protected from outside stress, and their use is therefore limited.

Polyetheretherketone (PEEK) is also known as an insulation material for electric wiring. PEEK has excellent properties such as mechanical strength, heat resistance, substantial chemical resistance (although not as chemically inert as PTFE), and is highly resistant to damage by scratching and abrasion. However, it is stiffer than many of the polymers above, and can be difficult to extrude in thin layers. Consequently, when PEEK is extrusion-coated on wire, difficulties in obtaining thin layers or maintaining uniform wall thickness may lead to unwanted stiffness and weight, and to loss of flexibility and handleability.

SUMMARY OF THE INVENTION

In consideration of the problems of prior materials mentioned above, the purpose of the present invention is to provide a flexible electrical-insulation material having characteristics desired for air-frame wire insulation, such as light weight, high mechanical strength, cut-through resistance, thermal resistance, chemical resistance, and reduced dielectric constant altogether simultaneously.

Another purpose of the present invention is to provide a substrate material for use with printed circuit boards for high frequency application.

An embodiment of the present invention, which achieves the purposes mentioned above, is an electrical insulation material comprising a continuously porous polytetrafluoroethylene (PTFE) tape and at least one layer of thin non-porous polyetheretherketone (PEEK) film, the latter being melt-bonded to one or both surfaces of the former.

Another embodiment of this invention provides an insulated wire that has excellent electrical properties and other characteristics desired in aircraft and spacecraft applications, such as light weight, flexibility, high mechanical strength, cut-through resistance, thermal resistance, and high resistance to solvents, oils, engine fuels, and other chemicals.

The insulated wire comprises at least one metal inner conductor surrounded, in sequence from inside to outside, by at least one layer of porous PTFE tape and at least one layer of non-porous PEEK film. The layers of porous PTFE tape and non-porous PEEK film are wrapped, in film form, on the metal inner conductor and are melt-bonded together.

Yet another embodiment of this invention provides a coaxial cable having a core of the insulated wire. The coaxial cable comprises at least one metal inner conductor surrounded, in sequence from inside to outside, by at least one layer of porous polytetrafluoroethylene (PTFE) tape and at least one layer of non-porous polyetheretherketone (PEEK) film. The layers of porous PTFE tape and non-porous PEEK film are wrapped, in film form, on the metal inner conductor and are melt-bonded together. At least one additional layer of electrically-conductive material surrounds the core of insulated wire.

DETAILED DESCRIPTION OF THE INVENTION

Figure 1:
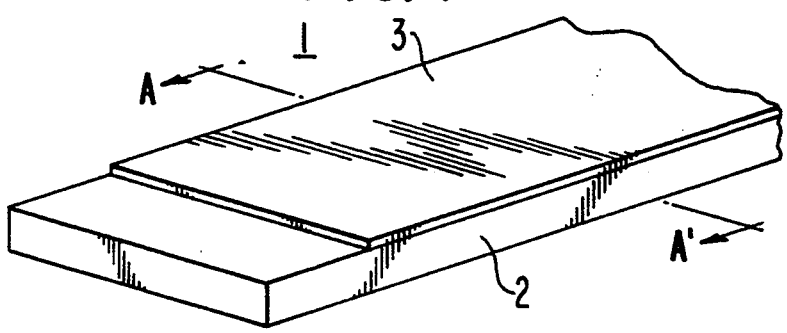
FIG. 1 is a perspective view of an example of the electrical insulation laminate of the present invention.

The electrical insulation laminate of the present invention can be produced by laying a PEEK film on one or both sides of a continuously porous PTFE tape, heating the combination at a temperature above the melting point of PEEK (334° C.) and compressing the combination, thereby the PEEK film is melted and anchored to the numerous fine pores of the PTFE tape to provide a unified laminate. The lamination can be performed by application of heat and pressure using conventional means, such as a heated-platen press, heated rolls, and the like.

The porous PTFE tape of the invention can be made by processes known in the art, for example, by paper-making processes, or by processes in which filler materials are incorporated with the PTFE resin and which are subsequently removed to leave a porous structure. Preferably the porous PTFE is porous expanded polytetrafluoroethylene as described in U.S. Pat. Nos. 3,953,566, 3,962,153, 4,096,227, and 4,187,390 which fully describe the preferred material and processes for making them.

PEEK films suitable for use in the invention are known in the art and are commercially available. Preferably the PEEK film is a non-porous film having a thickness of 25 micrometers or less, more preferably having a thickness of 10 micrometers or less.

The laminate thus obtained is light in weight, having a density from about 0.5 to 2.0 g/cc. Furthermore, it has good mechanical strength and cut-through resistance, heat resistance as high as 250° C., and is not affected by most chemicals. Thus, the electrical-insulation laminate satisfies the requirements for an air-frame wire insulation of light weight, high mechanical strength, heat resistance and chemical resistance simultaneously. The laminate can be slit to a narrow tape of a desired width, then wrapped around a conductor, followed by heating above the melting point of PEEK to form an insulated wire. The wire so obtained has, in addition to the excellent properties mentioned above, cut-through resistance, crush resistance and dimensional stability.

By adjusting the thickness ratio of the porous PTFE tape to the PEEK film, the dielectric constant of this electrical insulation laminate can be varied in the range from 1.3 to 2.5. When within the lower portion of the range of dielectric constant, the laminate can be used as a dielectric material for high speed signal transmission lines. Such transmission lines are crush resistant and free from an increase in the dielectric constant due to crushing, thus providing a stabilized signal transmission characteristic.

In addition to the application as an air-frame wire insulation, the laminate of the present invention can be used for a substrate of a flexible printed circuit board or a multi-layer printed circuit board. The laminate provides crush resistance, low dielectric constant, and light weight in the circuit boards so that the boards may be used in high frequency applications.

Embodiments of the present invention are now explained in detail with reference to the drawings.

Referring to FIG. 1, the electrical insulation laminate 1 was made as follows:

A PEEK film 3 is laid on one side of a continuously porous expanded PTFE tape 2 and heated and compressed to produce a laminate 1 consisting of the PEEK and PTFE tapes melt-bonded together. Melt-bonding can be performed by application of heat and pressure using conventional means, such as a heated-platen press, heated rolls, and the like. The processing time, temperature and pressure of lamination are interdependent and will be varied, mostly according to the thickness of the PEEK film 3, and the number of layers used. The temperature used is above the melting point of PEEK, which is 334° C., the pressure can range from about 1 to 7.5 kg/mm$^2$ and the processing time will range from a few seconds to several minutes. For example, a PTFE tape of 80 micrometers thickness and a PEEK tape of 7 micrometers thickness can be laminated together on a heated-platen press at a temperature of about 360° C., a pressure of 5 kg/mm$^2$, and a compression time of about 30 seconds.

Figure 2:
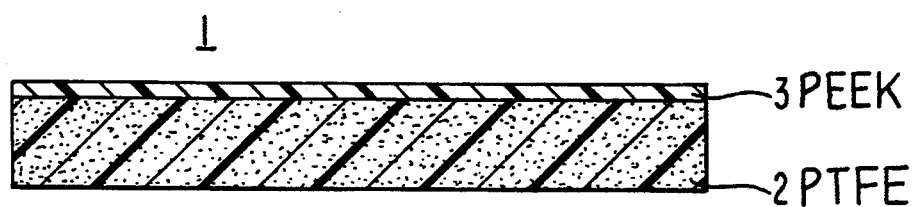
FIG. 2 is an A-A' cross section of the laminate of FIG. 1.

By doing this, the continuously porous PTFE tape, which has a network from one side to the other of a great many interconnected microscopic pores, allows some intrusion of molten PEEK into the pores of the surface region. Upon cooling the molten PEEK solidifies to adhere it to the PTFE tape by an anchoring effect limited to the surface region of the PTFE tape, as shown in FIG. 2. The peel strength between the PTFE tape 2 and the PEEK film 3 is about 0.2 kgf/cm-width which is enough to accomplish a tape-wrapped wire insulation without delaminating during wrapping.

For certain applications, for example, where increased flexibility or lower dielectric constant values are desired, and reduced strength and cut-through resistance can be tolerated, the PEEK layer can also be porous. Since the laminate is usable as long as the tape 2 and the film 3 do not slide with respect to each other, they can be melt-bonded in a discontinuous manner, for example, in such bonding patterns as dots, nets, straight lines, wavy lines and combinations thereof.

The electrical insulation laminate of the present invention has a thermal resistance as high as about 250° C., a chemical resistance to most chemicals except some concentrated acids, a light weight (density of about 0.6–1.8 g/cc), a low dielectric constant (1.3–2.5), as well as higher dimensional stability, crush resistance, and cut-through resistance than the continuously porous PTFE tape alone. The laminate has a tensile strength of 2.5 kg/mm$^2$ or more and elongation at break of 50% or more.

Figure 3:
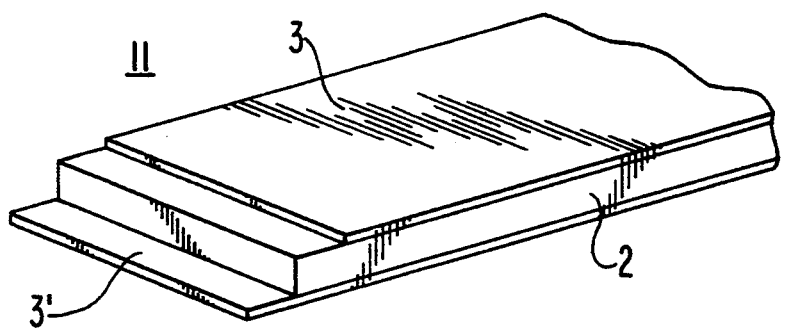
FIG. 3 is a perspective view of another example of the laminate of the present invention.

FIG. 3 shows another example of the electrical insulation laminate of the present invention. On both sides of a continuously porous 80 micrometers thick PTFE tape, PEEK films 3 and 3' were layered, and they were laminated as described above to give a three layer laminate 11.

Figure 4:
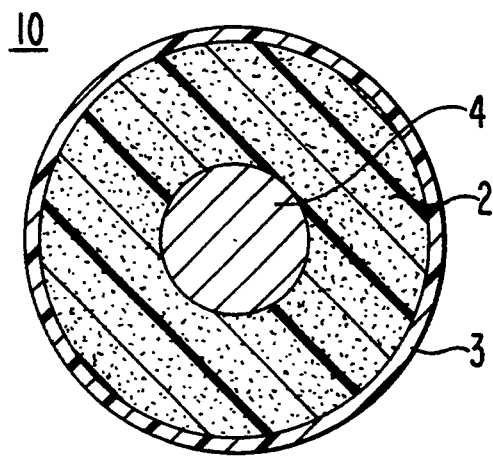
FIG. 4 is a cross-section of an insulated wire having a single layer of insulation.
Figure 5:
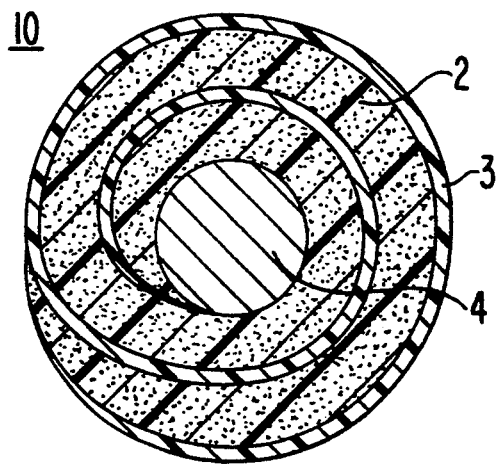
FIG. 5 is a cross-section of an insulated wire having an overlapped layer of insulation.

Referring now to FIGS. 4 and 5, insulated wire 10 is produced by wrapping a metal conductor 4, in sequence from inside to outside, with at least one layer 2 of porous PTFE, and at least one non-porous layer 3 of PEEK film. The porous PTFE layer 2 and PEEK layer 3 are wrapped on the metal conductor 4 in film form by conventional tape-wrapping means. For example, they can be wrapped in a spiral or helical manner having butt-joints between wraps so as to produce an insulation of a single layer of each material, as shown in cross-section in FIG. 4. They can also be wrapped in a spiral or helical manner in which each wrap is overlapped on the previous wrap so as to produce an insulation having more than one layer of each material, as shown in cross-section in FIG. 5. The insulating materials can be wrapped on the conductor as a laminate formed as described hereinabove or, alternatively, in separate layers by superposition of a PEEK layer surrounding a PTFE layer.

After the porous PTFE layer 2 and the PEEK layer 3 are wrapped on the metal conductor 4, either separately or in laminate form, the assembly is heated to a temperature higher than the melt temperature of PEEK for a time sufficient to permit slight penetration of the PEEK layer 3 into the pores of the surface region of the underlying PTFE layer 2, thus melt-bonding the layers together. It will be recognized that some experimentation may be needed to establish the optimum time and temperature conditions for melt-bonding as the conditions are dependent on the thickness, number, method of wrapping, etc. of the layers of insulating material forming the insulated wire.

Figure 6:
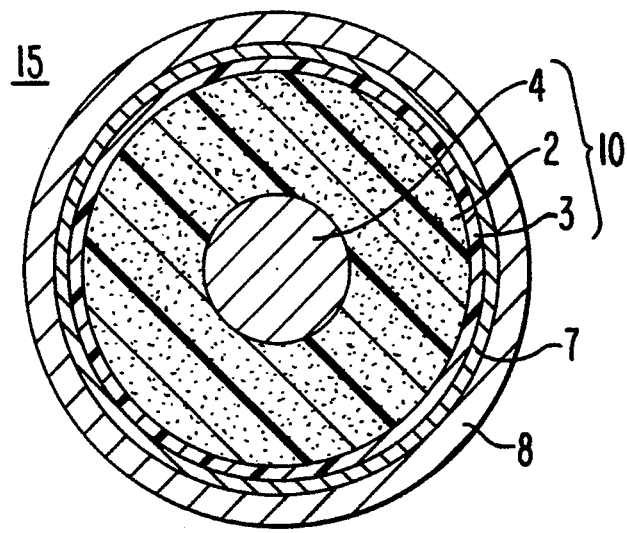
FIG. 6 is a cross-section of a coaxial cable of the invention.

A cross-section of a coaxial cable of the invention is depicted in FIG. 6. The coaxial cable 15 is made using the insulated wire described hereinabove as the core 10 comprising a metal conductor 4, at least one layer 2 of porous PTFE, and at least one layer 3 of PEEK. Surrounding the core is one or more outer conductors for electrical shielding, for example, a braided shield of copper wire 7 and a foil-served shield of metallized polyester tape 8. Typically, the coaxial cable as depicted will further comprise a jacket (not shown) of conventional jacketing materials.

TEST DESCRIPTION

Cut-through Resistance Test

Figure 7:
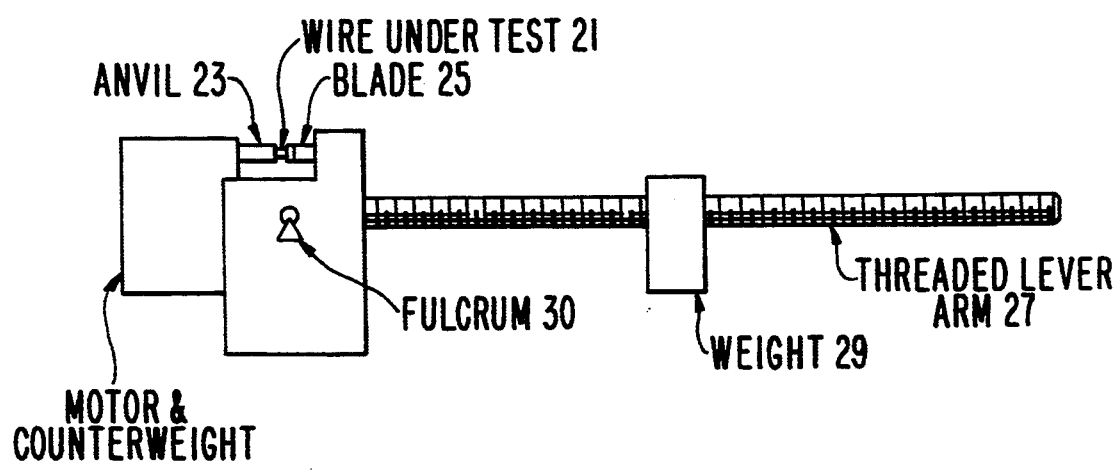
FIG. 7 is a simplified sketch of a cut-through resistance test apparatus.

Cut-through resistance of wire insulation is measured using the "Dynamic Cut-Through Resistance Test Machine" shown in FIG. 7.

A 12-inch long (30.5 cm) sample is supported and held in place by the anvil 23. A blade 25 with a 0.001-inch (25 micrometers) radius is positioned at an angle perpendicular to the axis of the sample wire 21 and against the outer surface of the insulation. The machine has a threaded arm 27 and weight 29 with a hole through it, having matching threads so that when the threaded lever arm is rotated, the weight moves traversely along the lever arm away from the fulcrum 30. As the weight moves, the force on the blade 25 is increased. The speed of rotation of the threaded lever arm is constant such that the force of the blade is increased at a rate of 10 kg/minute.

An electrical detection circuit senses when the blade has pierced the insulation and touches the conductor, and stops the rotation of the threaded lever arm. This is considered the end of the test. A timer measures the amount of time which has elapsed between the start and end of the test. This time measurement along with the known fixed rate at which the force increases allows the calculation of the force on the blade at failure. This is the dynamic cut-through resistance measurement.

Ten dynamic cut-through resistance measurements are made on each sample, and the results are averaged.

Test results are highly dependent on the local sharpness of the blade. This puts strict requirements on the blade hardness and uniformity across the entire cutting surface. Care must be taken to use only blades that are uniformly sharp and durable. The blade should be calibrated before each test.

One method to check the calibration of the blade is to test an AWG 30 solid wire insulated with a 0.00475-inch thickness (0.012 cm) of TEFZEL ® insulation. When the failure occurs at 1.0 kg-force plus or minus 0.1 Kg-force, the blade is at the desired sharpness.

Example 1

A thin non-porous PEEK film having a thickness of 7 micrometers was laid on one side of a continuously porous expanded PTFE tape having a thickness of 80 micrometers. The superposed PEEK film and PTFE tape were laminated together by application of heat and pressure in a heated platen press at a temperature of 360° C., a pressure of 5 kg/mm$^2$, and compression time of about 30 seconds to form the laminated electrical insulation tape of the present invention. The peel strength between the layers of the laminate was 0.2 kgf/cm-width.

The electrical insulation laminate 1a was slit to a desired width and wrapped around a stranded conductor (7/0.064 mm) to form an insulated wire of the invention. The insulated wire had an outer diameter of 0.5 mm and a dynamic cut-through resistance greater than 2.5 kg (measured using a cutting edge radius of 25 micrometers). For comparison, an equivalent insulated wire wrapped with a hot-melt polyester tape with a PVC adhesive layer had a dynamic cut-through resistance of 1.6 kg measured by the same method.

The insulated wire was fitted in an annealed copper tube and the tube was passed through a snug constricting die to make a semi-rigid coaxial cable. The propagation delay time (Tpd) of this semi-rigid cable was 3.84 nanosecond/m. Calculated from this value, the dielectric constant (Er) of this insulation was 1.325.

Example 2

An insulated wire of the invention was prepared as follows:

An AWG 34 (7/0.064 mm) stranded wire was wrapped with laminated electrical insulation tape made as described in Example 1. The laminated electrical insulation tape was wrapped in a helical manner with a 50 percent overlap. The tape-wrapped wire was heated at about 380° C. for about 45 seconds to melt-bond the layers together. The insulated wire was flexible, lightweight, and easy to handle.

Five samples of the insulated wire were tested for cut-through resistance using the Dynamic Cut-Through Test Machine. The insulation of the insulated wire was not cut through by the blade, and no electrical connection between the conductor and blade was made, even when the upper limit of the tester, 5 kg-force, was reached.

For comparative purposes, an insulated wire having the same construction except that the PEEK layer of the electrical insulation was replaced with a polyester tape coated with a polyvinyl chloride (PVC) hot-melt adhesive. The comparative insulated wire was cut through and failed at a load of less than 2 Kg.

Example 3

For evaluation as an air-frame wire, an insulated wire of the invention was prepared as follows:

An AWG 26 (19/0.102 mm) stranded wire was wrapped with a porous expanded PTFE tape. A 7 micrometers thick film of PEEK was then wrapped around the PTFE layer and melt-bonded to the PTFE to form an insulated wire having a use-rating of 600 volts and 200° C. The insulated wire thus prepared had an O.D. of 0.686 mm and weighed 1.930 kg/1000 meters. The insulated wire was flexible, lightweight, and easy to handle.

By comparison, a commercially available air-frame wire of the same rating, having double-wall crosslinked-ETFE insulation (conforming to Military Specification MIL-W-22759/41-26), had an O.D. of 1.016 mm and weighed 2.530 kg/1000 meters. Another counterpart wire, a polyimide-insulated wire having the same rating (and conforming to Military Specification MIL-W-

81381/7-22) had an O.D. of 0.864 mm and weighed 1.935 kg/1000 meters. Furthermore, the polyimide-insulated wire was far less flexible than the insulated wire of the invention.

Example 4

A stranded wire, AWG 34 (7/0.064 mm) and 0.192 mm O.D., was wrapped with a 80 micrometers thick porous expanded PTFE tape. A 7 micrometers thick film of PEEK was then wrapped around the PTFE layer and melt-bonded to the PTFE to form a coaxial cable core of insulated wire having an O.D. of 0.53 mm. The core was inserted into an outer conductor of copper pipe having a wall thickness of 0.08 mm. The copper pipe was drawn down through a constricting die to complete formation of a semi-rigid coaxial cable having an O.D. of 0.35 mm.

The semi-rigid coaxial cable had a remarkably good propagation delay time (Tpd) of 3.84 nanoseconds/meter. The dielectric constant (Er) of the electrical insulation of the cable was 1.33, and the capacitance was 72 picofarads/meter.

The present invention is not limited to the examples mentioned above. Parameters such as the thickness of the PTFE tape and PEEK film, number of layers laminated, lamination temperature, pressure and time can of course be varied in a wide range.

As detailed hereinabove, the electrical insulation material of the present invention has lightweight, high mechanical strength, high cut-through resistance, heat resistance, chemical resistance, low dielectric constant and dimensional stability. This laminate is therefore suitable for an air-frame wire insulation or high frequency printed circuit board dielectric substrate material.

I claim:

1. An electrical insulation laminate comprising a layer of porous polytetrafluoroethylene and at least one layer of polyetheretherketone, the latter being melt-bonded to one or both surfaces of the former.

2. An insulated electrical wire comprising, from inside to outside:
   (a) at least one metal inner conductor,
   (b) at least one layer of porous expanded polytetrafluoroethylene, and
   (c) at least one layer of polyetheretherketone;
   said layers being in film form wrapped on said conductor, and
   said layer of polyetheretherketone melt-bonded to said layer of porous expanded polytetrafluoroethylene.

3. The insulated electrical wire as recited in claim 2 wherein the layer of polyetheretherketone has a thickness of 25 micrometers or less.

4. The insulated electrical wire as recited in claim 3 wherein the layer of polyetheretherketone has a thickness of 10 micrometers or less.

5. An insulated electrical wire comprising, from inside to outside:
   (a) at least one metal inner conductor, and
   (b) at least one layer of a composite article comprising a layer of polyetheretherketone melt-bonded to a layer of porous expanded polytetrafluoroethylene;
   said composite article being in film form wrapped on the conductor.

6. The insulated electrical wire as recited in claim 5 wherein the layer of polyetheretherketone has a thickness of 25 micrometers or less.

7. The insulated electrical wire as recited in claim 6 wherein the layer of polyetheretherketone has a thickness of 10 micrometers or less.

8. A coaxial cable comprising, from inside to outside:
   (a) at least one metal inner conductor,
   (b) at least one layer of porous expanded polytetrafluoroethylene,
   (c) at least one layer of polyetheretherketone; and
   (d) at least one outer electrically-conductive layer;
   said layers of porous expanded polytetrafluoroethylene and polyetheretherketone being in film form wrapped on said inner conductor, and
   said layer of polyetheretherketone melt-bonded to said layer of porous expanded polytetrafluoroethylene.

9. The coaxial cable as recited in claim 8 wherein the layer of polyetheretherketone has a thickness of 25 micrometers or less.

10. The coaxial cable as recited in claim 9 wherein the layer of polyetheretherketone has a thickness of 10 micrometers or less.

* * * * *